United States Patent [19]

Abe et al.

[11] Patent Number: 5,266,557
[45] Date of Patent: Nov. 30, 1993

[54] METHOD OF FABRICATING SUPERCONDUCTING CERAMIC PIPE

[75] Inventors: Yoshihiro Abe, 1705, Higashiyama 6-chome, Nisshin-cho, Aichi-gun Aichi 470-01; Hideo Hosono, Nagoya; Takeshi Akamatsu, Kawasaki, all of Japan

[73] Assignees: Fujitsu Limited, Kawasaki; Yoshihiro Abe, Aichi, both of Japan

[21] Appl. No.: 798,246

[22] Filed: Nov. 26, 1991

[30] Foreign Application Priority Data

Nov. 30, 1990 [JP] Japan ................. 2-329904

[51] Int. Cl.$^5$ ............................. H01L 39/12
[52] U.S. Cl. ........................... 505/1; 264/304; 264/332; 505/739
[58] Field of Search ............. 264/269, 332, 301, 304; 505/1, 739, 740, 741, 730

[56] References Cited

U.S. PATENT DOCUMENTS

| | | | |
|---|---|---|---|
| 2,862,845 | 12/1958 | Szegvari | 264/301 |
| 3,016,597 | 1/1962 | Denes | 264/301 |
| 5,013,500 | 5/1991 | Hamanaka et al. | 264/301 |
| 5,047,391 | 9/1991 | Bock et al. | 505/1 |
| 5,070,071 | 12/1991 | Geballe et al. | 505/1 |
| 5,104,850 | 4/1992 | Provenzano et al. | 505/1 |

FOREIGN PATENT DOCUMENTS 63-231807 9/1988 Japan.
63-231809 9/1988 Japan.
63-248020 10/1988 Japan.

OTHER PUBLICATIONS

"Superconducting Glass-Ceramic Rods in BiCaSr-Cu$_2$O$_x$ Prepared by Crystallization under a Temperature Gradient", Abe et al, *Appl. Phys. Lett.* 53 (14), Oct. 3, 1988, pp. 1341-1342.

*Primary Examiner*—Jan H. Silbaugh
*Assistant Examiner*—Christopher A. Fiorilla
*Attorney, Agent, or Firm*—Nikaido, Marmelstein, Murray & Oram

[57] ABSTRACT

A method of fabricating a superconducting ceramic pipe including the steps of: melting a ceramic powder having a predetermined composition to form a melt; filling a supporting tube with the melt by a suction caused by a vacuum pressure; partially solidifying an outer part of the melt near the tube to form a shell (i.e., a ceramic pipe); discharging an inner unsolidified part at the center of the tube from the tube by gravity, to form a solidified ceramic pipe on the inside surface of the tube; and heat treating the ceramic pipe to convert it into a superconducting pipe. When a supporting tube with a bottom plate is used, the melt is poured into the tube, and the tube is turned over to remove an unsolidified melt, whereby a superconducting ceramic pipe with a bottom is fabricated.

11 Claims, 4 Drawing Sheets

METHOD OF FABRICATING SUPERCONDUCTING CERAMIC PIPE

BACKGROUND OF THE INVENTION

1. Field of the Invention

The present invention relates to super-conducting ceramic (oxide), and more particularly, to a method of fabricating a superconducting ceramic pipe.

2. Description of the Related Art

A ceramic pipe having no superconducting property has been fabricated by, for example, mixing a ceramic composition powder, a binder and water, to form a slurry, casting the slurry into a pipe-shaped cavity of a mold made of gypsum or the like, to form a green pipe, and then sintering the green pipe. This fabrication method can be applied for conventional ceramic pipes or tubes, but cannot be applied for superconducting ceramic pipes, since the water and binder (usually an organic compound) damage the superconducting properties, or prevent the super-conducting properties from appearing. Even though the water and binder are removed during the sintering step, a reducing effect due to the organic compound used at the sintering step prevents the superconducting properties from appearing.

It is possible to fabricate a superconducting ceramic pipe by mixing raw materials, calcinating the mixed material, grinding the calcinated material into a powder, pressing the powder filled in a pipe-shaped cavity of a metal die into the form of a green pipe, and sintering the green pipe under an oxygen-containing atmosphere. In this case, however, it is difficult to obtain a ceramic pipe having a small diameter and a long length, since the pressing step involves problems with the metal die, pressing machine, and a uniform compacting, etc.

SUMMARY OF THE INVENTION

An object of the present invention is to provide a method of easily and cheaply fabricating a super-conducting ceramic pipe, with or without a bottom thereof, in a manner different from that of the above-mentioned methods.

Another object of the present invention is to fabricate a superconducting ceramic pipe having a uniform quality, a large mechanical strength, a small diameter, and a long length.

The above-mentioned objects and other objects of the present invention are attained by providing a method of fabricating a superconducting ceramic pipe, comprising the steps of: melting a ceramic powder having a predetermined composition to form a melt; sucking the melt into a supporting tube to fill the tube with the melt; solidifying an outer part of the melt near the tube; discharging an inner unsolidified part at the center of the tube out of the tube, to thereby form a ceramic pipe on the inside surface of the tube; and; heat treating the ceramic pipe to convert same into a superconducting pipe.

The ceramic pipe can be taken out of (drawn from) the supporting tube before or after the heat treatment step, but preferably the pipe is taken out of the tube before the heat treatment, since during the heat treatment an atmosphere containing oxygen comes into contact with the inner and outside surfaces of the pipe, to thereby reduce the treating time thereof compared to that for the other pipe still enclosed in the tube.

Also, preferably a material of the superconducting ceramic is one selected from the group consisting of Bi—Sr—Ca—Cu—O system and Bi—Pb—Sr—Ca—Cu—O system, as when such a ceramic material is melted, the melt has a low viscosity.

Such a low viscosity melt can be easily sucked into the supporting tube by inserting the tube into the melt bath and forming a vacuum pressure in the tube, to thus draw the melt into the tube. Therefore, when the vacuum pressure is eliminated, to restore an atmospheric pressure in the tube, the unsolidified part of the melt is drawn out by gravity and discharged from the tube. It is possible to fill the tube with the melt by inserting the tube into the melt bath and apply a relatively low pressure to the melt bath surface to raise the melt into the tube (i.e., to fill the tube with the melt). In this case, when the application of the low pressure is stopped, to restore an atmospheric pressure, the unsolidified part of the melt flows out of the tube back into the bath.

Where a supporting tube having a small diameter and a long length is used, the melt can be easily raised to a high level within the tube, and thus it is possible to form a ceramic pipe having an outer diameter of from 2 to 20 mm and a length of 500 mm or less.

A thickness of the ceramic pipe is based on the solidified part of the melt coming into contact with the wall of the supporting tube, and is controlled by a time used for holding the melt in the tube, a thickness of the tube, and a temperature of the tube. Preferably, the thickness of the ceramic pipe is 5 mm or less.

The supporting tube is made of ceramic, such as silica glass, zirconia and alumina or metal, such as stainless steel, platinum, copper, copper alloy and silver.

It is possible to set an additional supporting tube, having a diameter smaller than that of the supporting tube, in the supporting tube. In this case, at the filling step, the melt fills the additional supporting tube and the space between the tubes, and thus the discharge of the unsolidified melt forms three ceramic pipes.

It is also possible to set a core metal rod in the supporting tube. In this case, at the filling step, the melt fills the space between the rod and the tube, and thus the discharge of the unsolidified melt forms the ceramic pipe and leaves a ceramic coating on the rod.

According to the present invention, it is possible to fabricate a superconducting ceramic pipe with a bottom, by the following steps: melting a ceramic powder having a predetermined composition to form a melt; pouring the melt into a supporting tube provided with a bottom plate; partially solidifying an outer part of the melt near the tube and bottom plate; removing the bottom plate; discharging an inner unsolidified part of the melt to thereby form a ceramic pipe with a bottom on the inside surface of the tube; taking the ceramic pipe out of the tube; and heat treating the ceramic pipe to convert same into a superconducting pipe with a bottom.

It is also preferable that a material of the superconducting ceramic is one selected from the group consisting of Bi—Sr—Ca—Cu—O system and B—Pb—Sr—Ca—Cu—O system, as when such a ceramic material is melted, the melt has a low viscosity. Accordingly, the melt is poured from a crucible holding a melt bath into the supporting tube with the bottom plate, and then the unsolidified part of the melt is discharged by turning over the supporting tube. Preferably, the ceramic pipe has an inner diameter of 30 mm or more.

The supporting tube is made of ceramic, such as, silica glass zirconia and alumina, or metal, such as stainless steel, platinum copper, copper alloy and silver.

The bottom plate is made of silica glass, graphite, stainless steel, copper, copper alloy, platinum or silver.

It is preferable to carry out the heat treatment at a temperature of from 700° to 850° C., for a period of from 0.5 to 200 hours, under an atmosphere containing oxygen (e.g, air), to thereby convert a non-superconducting ceramic (green) pipe to a superconducting pipe.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Referring to FIGS. 1a to 1d and FIG. 2, a superconducting ceramic pipe is fabricated in accordance with a first embodiment of the present invention, in the following manner.

EXAMPLE 1

Figure 1A:
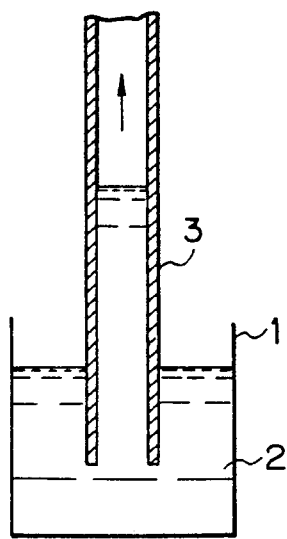
FIGS. 1a to 1c are schematic sectional views of a supporting tube with a melt or a ceramic pipe therein.

First, oxide powder raw materials (e.g., $Bi_2O_3$, $SrCO_3$, $CaCO_3$ and $CuO$) were prepared to obtain a superconducting ceramic compound of, e.g., a Bi-Sr-Ca-Cu-O system. The powders were mixed and melted in a high alumina (or Pt) crucible 1 at a temperature of about 1100° C. (to 1300° C.), for about 30 minutes in an electric furnace, to form a melt 2 having a predetermined composition of, e.g., $Bi_2Sr_2Ca_1Cu_2O_x$, as shown in FIG. 1a. The melt 2 had a very low viscosity.

Then, a supporting tube 3 having both ends open was inserted into the melt bath 2, and immediately the melt 2 was sucked up into the tube by applying a vacuum pressure to the tube 3, to thus fill the tube 3 with the melt 2, as shown in FIG. 1a. For example, a silica glass tube 3 having an outer diameter of 7 mm, an inner diameter of 5.5 mm, and a length of 500 mm was inserted in the melt bath 2, and the melt 2 was sucked therein by using a conventional vacuum pump connected to the upper open end of the tube 3, to raise the melt 2 to a level of about 300 mm from the bath level, for 1 second.

Figure 1B:
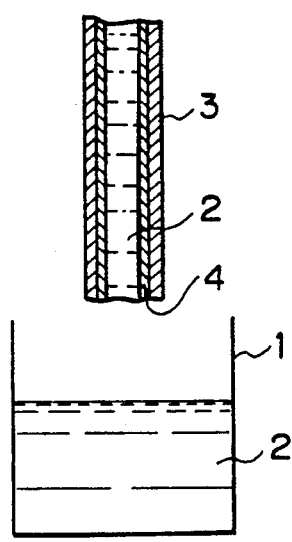

As shown in FIG. 1b, the supporting tube 3 holding the melt 2 therein was lifted out of the melt bath 2, and an outer part of the melt 2 near the tube 3 was gradually solidified by cooling the tube 3, to thereby form a shell therein, i.e., a solidified ceramic pipe 4.

Figure 1C:
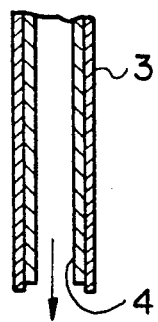

Before a complete solidification of the melt 2 held in the tube 3, the vacuum suction was stopped and the upper end of the tube 3 was opened to the air, to discharge an unsolidified inner part of the melt out of a center portion of the tube 3 by gravity. As a result, the solidified outer part 4 which was lightly adhered to the inside surface of the tube 3, remained within the tube 3, as shown in FIG. 1c. If a tube 3 having a relatively small inner diameter is used, immediately after the stoppage of vacuum suction, it is preferable to feed pressurized air into the tube 3 to thereby accelerate the discharge of the unsolidified part.

Figure 2:
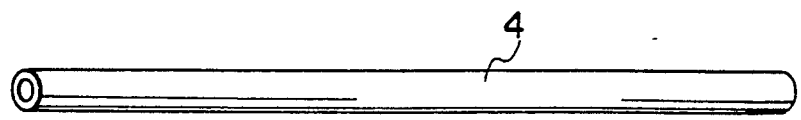
FIG. 2 is a schematic perspective view of the obtained ceramic pipe.
Figure 3:
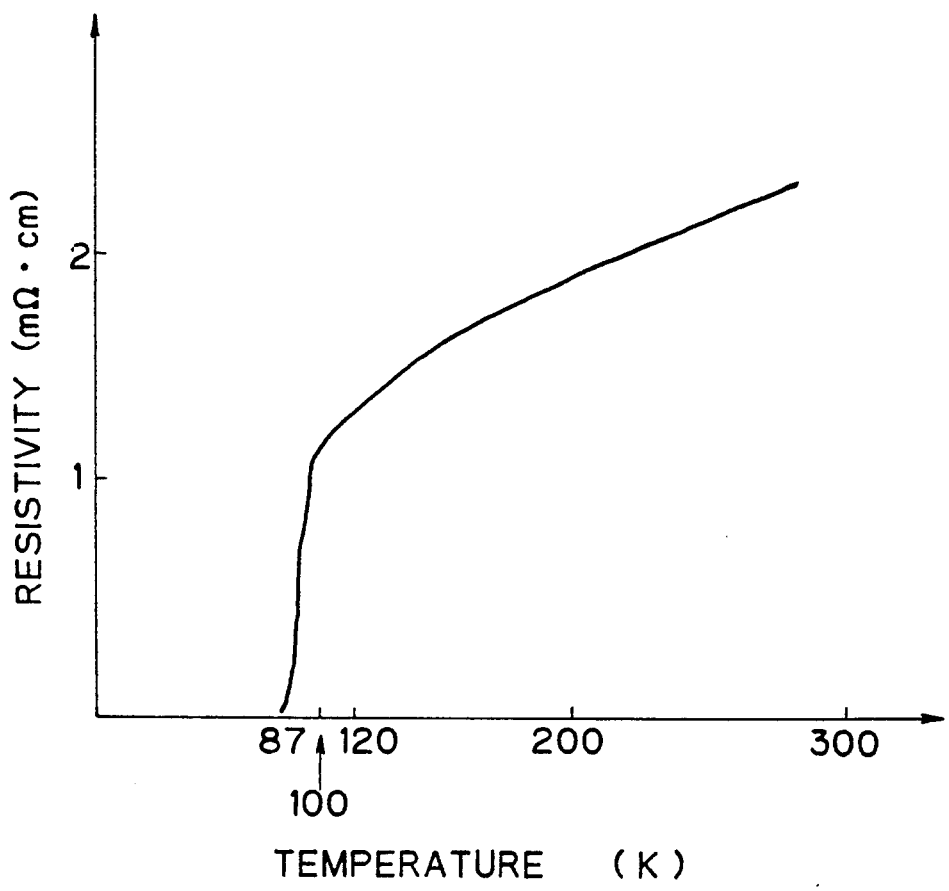
FIG. 3 is a graph showing a relationship between the electrical resistivity and temperature.
Figure 4:
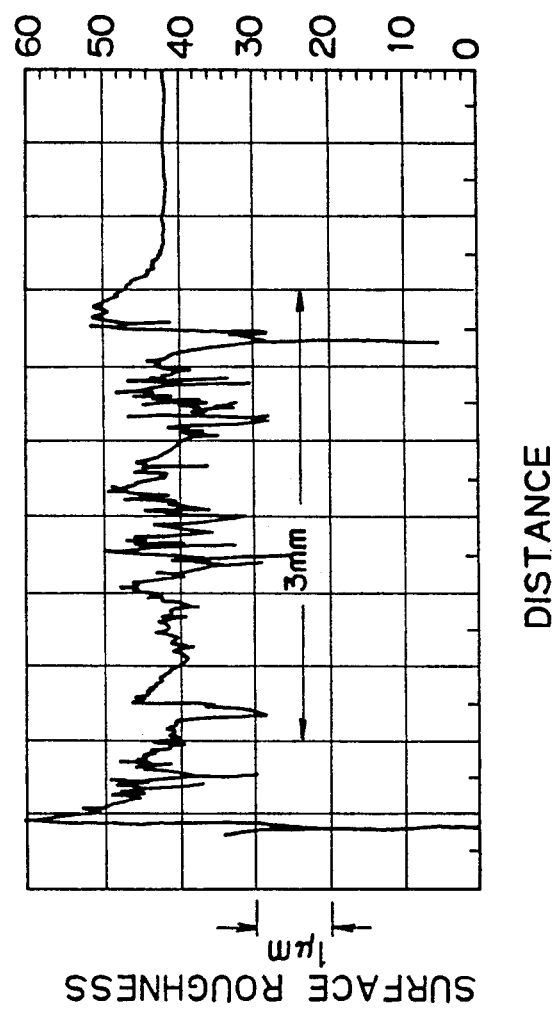
FIG. 4 is a graph showing a roughness of an outside surface of the superconducting ceramic pipe.

After cooling the supporting tube 3 holding the ceramic pipe 4, the ceramic pipe 4 was removed mechanically from the tube 3 with a relatively light force, to thus obtain a ceramic pipe 4 having open ends as shown in FIG. 2. For example, 0.3 seconds after the filling, the vacuum suction was stopped, and simultaneously, the unsolidified inner part was removed by gravity to form a ceramic pipe 4 of $Bi_2Sr_2Ca_1Cu_2O_x$ and having a weight of 590 g, an outer diameter of 5.5 mm, an inner diameter of 4.5 mm, and a length of about 300 mm. Since the obtained ceramic pipe 4 had no superconducting property, it was subjected to a heat treatment to convert it into a superconducting ceramic pipe. The heat treatment was performed under the conditions of a heating temperature of from 700° to 860° C., a heating time of from 10 to 100 hours, and an atmosphere containing oxygen. For example, the obtained ceramic pipe 4 was heated at 800° C. for 50 hours in an air atmosphere, and then taken out of a furnace to be cooled in the air. The fabricated superconducting pipe 4 had a superconductivity as shown in FIG. 3, a very smooth outside surface as shown in FIG. 4, and a high bending strength of 800 to 1500 kg/cm$^2$.

The above-mentioned fabrication method is suitable for supporting tubes having an inner diameter of 0.2 to 20 mm. Note, it is possible to perform the heat treatment before removing the pipe 4 from the tube 3, and it is possible to use alumina, zirconia, copper, copper alloy, stainless steel and silver, instead of silica glass, as a material of the supporting tube. Also, if the ceramic pipe is formed in the copper tube, is heat-treated therein, and is not removed from the tube, a composite pipe consisting of an inner superconducting ceramic pipe and an outer copper tube can be obtained.

When an additional (second) supporting tube having an outer diameter smaller than an inner diameter of the (first) supporting tube is set in the supporting tube, three ceramic pipes can be fabricated at the same time. In this case, the melt fills spaces within the second supporting tube and between the first and second tubes, and thus three solidified shells are formed on the inner and outside surface of the second tube and the inside surface of the first tube, and when the unsolidified parts are discharged, three ceramic pipes are obtained.

Furthermore, when a core metal (e.g., copper) rod is set in the supporting tube, the ceramic pipe and a ceramic coating on the rod are fabricated. In this case, the melt fills a space between the rod and the supporting tube, and thus two solidified shells are formed on the outside surface of the rod and the inside surface of the tube, and when the unsolidified melt is discharged, a ceramic pipe and a ceramic coated rod are obtained. The coated rod is then heat treated to convert same into a superconductor, to thereby fabricate a metal rod coated with the superconducting ceramic coating (pipe).

Referring to FIGS. 5a to 5d and FIG. 6, a superconducting ceramic pipe with a bottom is fabricated in accordance with a second embodiment of the present invention, in the following manner.

EXAMPLE 2

Figure 5A:
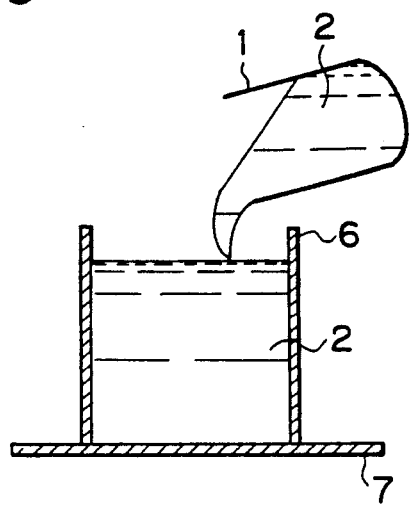
FIGS. 5a to 5c are schematic sectional views of another supporting tube with a melt or a ceramic pipe therein.

The ceramic melt 2 was prepared in the high alumina crucible 1, as explained in Example 1, a supporting tube 6 having an inner diameter of, e.g., 10 mm or more, was set on a bottom plate 7, and then the melt 2 was poured into the tube 6 as shown in FIG. 5a. For example, the tube 6 was made of silica glass and had an inner diameter of 30 mm and an outer diameter of 34 mm, and the plate 7 was made of carbon and had a thickness of 10 mm.

Figure 5B:
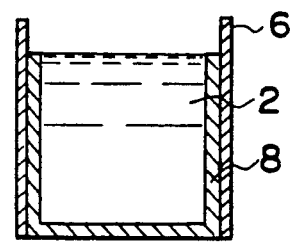

When the melt 2 came into contact with the tube 6 and plate 7, and was thus cooled, the outer part of the melt 2 was solidified to form a shell 8 having a cup shape (i.e., a ceramic pipe with a bottom), as shown in FIG. 5b, and then the bottom plate 7 was removed. If necessary, the plate 7 can be held in contact with the tube 6.

Figure 5C:
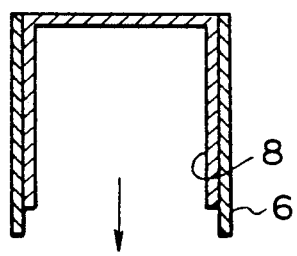

Next, as shown in FIG. 5c, the tube 6 with the melt was turned upside down, to discharge unsolidified melt out of the tube 6, and as a result, the solidified outer part 8, which was lightly adhered to the inside surface of the tube 6, remained within the tube 6.

Figure 6:
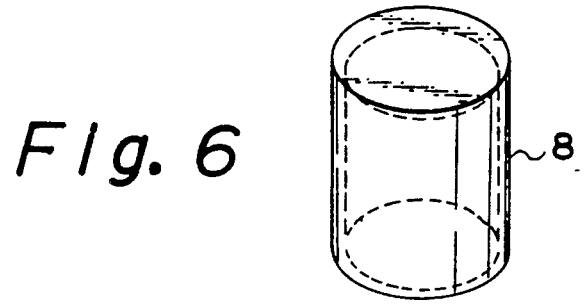
FIG. 6 is a schematic perspective view of the obtained ceramic pipe with a bottom.

After cooling the supporting tube 6 holding the ceramic pipe 8, the ceramic pipe 8 was removed mechanically from the tube 3, with a relatively light force, to obtain the ceramic pipe 8 with a bottom as shown in FIG. 6. For example, 3 seconds after the filling, the tube 6 was turned over to remove the unsolidified part and to form the ceramic pipe 8 with a bottom and made of $Bi_2Sr_2Ca_1Cu_2O_x$, and having a weight of 130 g, an outer diameter of 30 mm, an inner diameter of 26 mm and a length of about 200 mm. Since the obtained ceramic pipe 8 had no superconducting property, it was subjected to a heat treatment, to convert it into a superconducting ceramic pipe under the conditions explained in Example 1, and thus a superconducting ceramic pipe 8 with a bottom was obtained.

It is possible to perform the heat treatment before removing the pipe 8 from the tube 6, and it is possible to use alumina, copper, zirconia, copper alloy, stainless steel, platinum, and silver, instead of silica glass, as a material of the supporting tube, and to use silica glass, copper, copper alloy, stainless steel, platinum, and silver, instead of graphite, as a material of the bottom plate. If the ceramic pipe is formed in the copper tube, is heat-treated, and is not removed from the tube, a composite pipe consisting of an inner superconducting ceramic pipe with a bottom and an outer copper tube can be obtained.

As mentioned above, according to the present invention, it is easy and simple to fabricate a superconducting ceramic pipe with open ends or a bottom, the pipe having a small diameter, a long length, an uniform quantity, a large mechanical strength, and a smooth outside surface.

It will be obvious that the present invention is not restricted to the above-mentioned embodiments and that many variations are possible for persons skilled in the art without departing from the scope of the invention.

We claim:

1. A method of fabricating a superconducting ceramic pipe comprising the steps of:
    melting a ceramic powder having a predetermined composition to form a melt;
    sucking said melt into a supporting tube having an inside surface;
    solidifying only an outer part of the melt near said inside surface leaving melt in an inner part of said tube in unsolidified form;
    discharging said unsolidified melt from the tube, to thereby form a ceramic pipe on the inside surface of said tube;
    separating said ceramic pipe from said tube; and
    heat treating said ceramic pipe to convert such into a superconducting pipe.

2. A method according to claim 1, wherein said step of separating said ceramic pipe from said tube is carried out before said heat treatment step.

3. A method according to claim 1, wherein said step of separating said ceramic pipe from said tube is carried out after said heat treatment step.

4. A method according to claim 1, wherein a material of said superconducting ceramic is one selected from the group consisting of a Bi—Sr—Ca—Cu—O system and a Bi—Pb—Sr—Ca—Cu—O system.

5. A method according to claim 1, wherein a material of said supporting tube is one selected from the group consisting of silica glass, alumina, zirconia, copper, copper alloy, stainless steel, platinum, and silver.

6. A method according to claim 1, wherein an additional supporting tube having a diameter smaller than that of said supporting tube is set in said supporting tube, and at the filling step, said melt is filled in spaces within the additional supporting tube and between the tubes, whereby after the discharge of the unsolidified melt, three ceramic pipes are formed.

7. A method according to claim 1, wherein said sucking step is performed by forming a vacuum in said supporting tube, so that said melt is sucked into the tube, and said discharge step is performed by restoring atmospheric pressure therein.

8. A method of fabricating a superconducting ceramic pipe with one closed end, comprising the steps of:
    melting a ceramic powder having a predetermined composition to form a melt;
    pouring said melt into a supporting tube having an inside surface and provided with a bottom plate;
    solidifying only an outer part of the melt near said inside surface of said tube and said bottom plate leaving melt in an inner part of said tube in unsolidified form;
    removing said bottom plate;
    discharging said inner unsolidified part of said melt, to thereby form said ceramic pipe with one closed end on the inside surface of said tube;
    separating said ceramic pipe from said tube; and
    heat treating said separated ceramic pipe to convert such into a superconducting pipe with one closed end.

9. A method according to claim 8, wherein a material of said superconducting ceramic is one selected from the group consisting of a Bi-Sr-Ca-Cu-O system and a Bi-Pb-Sr-Ca-Cu-O system.

10. A method according to claim 8, wherein a material of said supporting-tube is one selected from the group consisting of silica glass, alumina, zirconia, copper, copper alloy, stainless steel, platinum, and silver.

11. A method according to claim 8, wherein a material of said bottom plate is one selected from the group consisting of silica glass, graphite, stainlesss teel, copper, copper alloy, platinum, and silver.

* * * * *